(12) United States Patent
Morii

(10) Patent No.: US 6,853,130 B2
(45) Date of Patent: Feb. 8, 2005

(54) ORGANIC ELECTROLUMINESCENT DEVICE AND MANUFACTURING METHOD THEREFOR

(75) Inventor: Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 630 days.

(21) Appl. No.: 09/810,233

(22) Filed: Mar. 19, 2001

(65) Prior Publication Data

US 2002/0039730 A1 Apr. 4, 2002

(30) Foreign Application Priority Data

Mar. 21, 2000 (JP) ........................................ 2000-078664

(51) Int. Cl.$^7$ ............................................... H05B 33/00
(52) U.S. Cl. ........................ 313/503; 313/498; 313/504; 313/506; 313/311; 428/690
(58) Field of Search ................................ 313/311, 498, 313/503, 504, 506; 428/690

(56) References Cited

U.S. PATENT DOCUMENTS 5,739,545 A * 4/1998 Guha et al. ................. 313/504
6,023,073 A * 2/2000 Strite ......................... 313/504
6,252,253 B1 * 6/2001 Bao et al. ................... 313/506

OTHER PUBLICATIONS

Gu, G. et al., "Transparent organic light emitting devices", Appl. Phys. Lett., vol. 68, No. 19, May 6, 1996, pp. 2606–2608.

* cited by examiner

Primary Examiner—Nimeshkumar D. Patel
Assistant Examiner—Sharlene Leurig
(74) Attorney, Agent, or Firm—Oliff & Berridge, PLC

(57) ABSTRACT

An organic electroluminescent device includes an anode, a light-emitting layer, and a cathode, which has a structure formed by sequentially laminating, from the light-emitting layer side, a first cathode formed of a material having a work function of 3.0 eV or less, and a second cathode, formed of a material having a work function higher than that of the first cathode, so that the total thickness of the first and the second cathodes is 100 angstroms or less. These elements are stacked on a substrate, and light is emitted to an exterior of the device via at least the cathode.

8 Claims, 3 Drawing Sheets

ORGANIC ELECTROLUMINESCENT DEVICE AND MANUFACTURING METHOD THEREFOR

BACKGROUND OF THE INVENTION

1. Field of Invention

The present invention relates to organic electroluminescent devices, which are electrical device light emitting devices used for displays, light sources for displays, and the like, and to manufacturing methods therefor.

2. Description of Related Art

Recently, as self-luminous displays replace liquid crystal displays, development has been advancing rapidly of light-emitting devices (organic electroluminescent devices, hereinafter referred to as "organic EL devices"), which have a structure in which a light-emitting layer formed of an organic material is provided between an anode and a cathode. Among these, a high-transmission EL device, a so-called transparent EL device (TOELD) used in the visible light region, which can emit light from the two electrode sides, has been desired, since overlapped displays can be performed by disposing another display device thereunder. A particular structure of this device is disclosed in, for example, Appl. Phys. Lett. 68(19), 6 May 1996, p 2606. In this publication, it is disclosed that an aluminum complex Alq3, which is a low molecular material, is used as a light-emitting layer, a cathode is formed by co-deposition of Mg and Ag, an ITO film is formed by sputtering thereon for sealing or for assistance to the cathode so as to form a device, and a threshold voltage of approximately 8 V is achieved. In the structure described above, in view of the life and the threshold characteristics of a material used for the light-emitting layer, Mg and Ag are used for the cathode, and in addition, ITO is used for the upper layer thereon.

Concerning organic EL devices, a light-emitting material having a low threshold value can be used for a light-emitting layer, and a metal material having a low work function can be used for a cathode so as to realize operation at a low threshold voltage. However, in the structure proposed in the paper described above, Mg and Ag are not sufficient in view of the work functions, and since ITO is additionally deposited on the metal material by sputtering, in order to prevent the degradation thereof, Mg is oxidized, whereby a problem may arise in that an increase in threshold voltage of the device cannot be finally avoided.

SUMMARY OF THE INVENTION

The present invention addresses the above problem, and an object of the present invention is to provide an organic electroluminescent device, which can be operated at a low voltage, and which has high efficiency, high transmission characteristics, and a long life. It is also an object of the invention to provide a manufacturing method therefor.

According to the present invention, an organic EL device is provided, which includes an anode, a light-emitting layer formed of an organic material, and a cathode, which has a structure in which a first cathode, formed of a material having a work function of 3.0 eV or less, and a second cathode, formed of a material having a work function higher than that of the first cathode, are sequentially stacked from the light-emitting layer side, and the total thickness of the first and the second cathodes, being 100 angstroms or less, are stacked on a substrate, and light is emitted to the exterior of the device via at least the cathode.

In addition, according to the present invention, a method for manufacturing an organic electroluminescent device is provided, which includes the steps of: forming an anode on a substrate; forming a light-emitting layer formed of an organic material above the anode; and forming a cathode above the light-emitting layer by laminating a first cathode, formed of a material having a work function of 3.0 eV or less, and a second cathode, formed of a material having a work function higher than that of the first cathode, from the light-emitting layer side, so that the total thickness of the first and the second cathodes is 100 angstroms or less.

DETAILED DESCRIPTION OF PREFERRED EMBODIMENTS

An organic EL device of the present invention includes an anode and a light-emitting layer formed of an organic material provided on a substrate. A cathode is provided, which has a structure in which a first cathode, formed of a material having a work function of 3.0 eV or less, and a second cathode, formed of a material having a work function higher than that of the first cathode, are sequentially stacked with each other from the light-emitting layer side. The total thickness of the first and the second cathodes is 100 angstroms or less. Light is emitted to the outside via at least the cathode.

Preferred features of the organic EL device include the following:

(1) In the organic EL device, the cathode side is sealed by a sealing layer formed of a transmissive material.
(2) In the organic EL device, the first cathode includes Ca.
(3) In the organic EL device, the thickness y (angstrom) of the first cathode is such that $50 \leq y \leq 80$ holds.
(4) In the organic EL device, the thickness y (angstrom) of the first cathode is such that $55 \leq y \leq 65$ holds.
(5) In the organic EL device, the second cathode includes Al.
(6) In the organic EL device, the thickness z (angstrom) of the second cathode is such that $10 \leq z \leq 20$ holds.
(7) In the organic EL device, an organic material forming the light-emitting layer is a polymeric material.

In addition, a method for manufacturing an organic EL device of the present invention includes the steps of forming an anode on a substrate; forming a light-emitting layer formed of an organic material above the anode; and forming a cathode above the light-emitting layer by laminating a first cathode, formed of a material having a work function of 3.0 eV or less, and a second cathode, formed of a material having a work function higher than that of the first cathode, from the light-emitting layer side, so that the total thickness of the first and the second cathodes is 100 angstroms or less.

Preferred features of the method for manufacturing the organic EL device include the following:

(8) In the step of forming the anode in the method for manufacturing the organic EL device, after an electrode film is formed, an oxygen or an air plasma treatment is performed under conditions in which a current x and a time t are set such that 10 (mA)$\leq$x$\leq$15 (mA) and 5 (minute)$\leq$t$\leq$7 (minute) hold.

(9) In the step of forming the anode in the method for manufacturing the organic EL device, after an electrode film is formed, an oxygen or an air plasma treatment is performed under conditions in which a current x and a time t are set such that 10 (mA)$\leq$x$\leq$12 (mA) and t=5 (minutes) hold.

Hereinafter, the embodiments of the present invention will be described in detail with reference to drawings.

Figure 1:
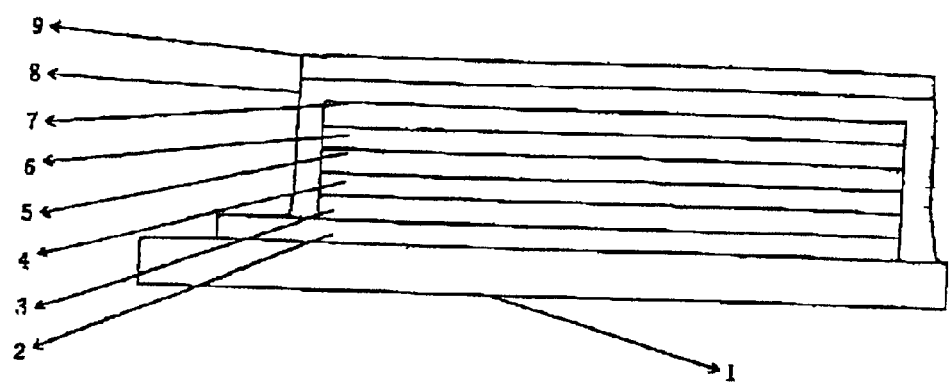
FIG. 1 is a cross-sectional view showing a device structure of an organic EL device according to an embodiment of the present invention.

FIG. 1 is a cross-sectional view showing the structure of an organic EL device according to the present invention.

In the structure shown in FIG. 1, the following elements are stacked on a substrate 1: an anode 2, a hole injection/transport layer 3, a light-emitting layer 4 formed of an organic material, a first cathode layer 5 formed of a material having a work function of 3.0 eV or less, and a second cathode 6 (a cathode is formed of a stacked structure of the first and the second cathodes mentioned above) formed of a material having a work function higher than that of the first cathode. Next, the stacked structure described above is sealed by a first sealing layer 7, and a second insulating layer 8, and in addition, is sealed by a sealing substrate 9.

As the substrate 1, a transparent material, such as glass, or a reflective material, may be used. When the transparent material is used, light can be emitted to the outside via at least the substrate 1.

As a material used for the anode, for example, ITO or IDIXO (manufactured by Idemitsu Kosan Co., Ltd.) may be used as a transparent electrode material. The material mentioned above is deposited on a substrate so as to form an electrode by sputtering or the like. The transparent electrode thus formed is preferably processed by an oxygen plasma treatment or an air plasma treatment after the material is deposited.

The plasma treatment mentioned above is preferably performed at a current of 10 mA to 15 mA for 5 minutes to 7 minutes as a treatment time, and is more preferably performed at a current of 10 mA to 12 mA for 5 minutes. When the treatment time is less than 5 minutes, in particular, the transmittance of the wavelength in the range of 400 to 550 nm is decreased by up to 3 to 5%, compared to that in the case in which the treatment time is more than 5 minutes. In contrast, from minutes to 10 minutes for the treatment, an increase in transmittance in the region of the wavelength mentioned above is not observed. For example, when an oxygen plasma treatment is performed, it is preferable that VPS020 manufactured by Sanyu Electron Co., Ltd. be used, and that the treatment be performed after purging is performed 2 to 3 times by using oxygen.

In addition, when the current is less than 10 mA, the uniformity of surface treatment may be degraded in some cases, and when the current is more than 15 mA, a decrease in film thickness may occur by ashing in some cases. In addition, a decrease in transmittance of the wavelength in the range of 600 to 800 nm is observed by the treatment described above in accordance with the treatment time. Compared to the case in which the treatment is not performed, when the treatment is performed for 10 minutes, a decrease in transmittance by up to approximately 2% is observed. This may occur due to a change in band structure caused by oxidation of the surface of the transparent electrode, and by the generation of defects therein due to the treatment described above. Accordingly, an oxygen plasma treatment or an air plasma treatment is preferably performed approximately at 10 mA for 5 minutes, and as a result, an increase in transmittance in the vicinity of 500 nm, to which humans are more sensitive, and an increase in transmittance on average in the visible light region can be realized.

In this connection, when the transparent electrode material described above is used for the anode 2, light can be emitted to the exterior of the device via at least the substrate 1.

In addition, as the anode 2, for example, a layer formed of a metal, such as Pt, Ir, Ni, Pd, or Au, or a stacked structure of a transparent material layer formed of ITO or the like and a reflective layer formed of Al or the like may be used.

Furthermore, the substrate provided with the anode 2 formed thereon is preferably an active matrix substrate having a plurality of anodes disposed thereon and switching devices, such as thin-film transistors, each provided for each anode.

In this embodiment, the hole injection/transport layer 3 is provided between the anode 2 and the light-emitting layer 4. In this connection, the hole injection/transport layer 3 is a layer having a function of hole injection or hole transfer from the anode 2 to the light-emitting layer side. For the hole injection/transport layer 3 described above, a mixture of polyethylenedioxy-thiophene

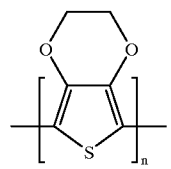

and polystyrene sulfonate,

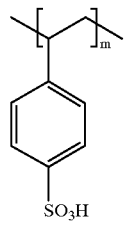

copper phthalocyanine, or the like is preferably used.

For the light-emitting layer 4, a low molecular weight organic light-emitting material or a polymeric light-emitting material may be used, a fluorene-based polymer is preferably used, and in particular,

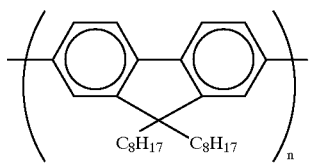

polymeric organic material, such as PPV (poly-p-phenylenevinylene) is preferably used.

For the first cathode 5, as described above, a material having a work function of 3.0 eV or less is used. As the cathode material mentioned above, in particular, Ca is preferably used. Specifically, Ca is preferable since a low threshold voltage, because of the low work function, and a high transmittance, because of the low reflectance for visible light, can be realized. The thickness of the first cathode described above is preferably from 50 to 80 angstroms, and more preferably, from 55 to 65 angstroms. When the thickness is less than 50 angstroms, due to the influence of the work function of the second cathode 6, which is an upper layer, there may be a risk in that the threshold voltage of the device is increased. In addition, when it is 80 angstroms or more, there may be a risk in that the transmittance is significantly decreased.

In particular, in the case in which Ca is used, since Ca has absorption over almost the entire visible wavelength region, when the thickness thereof is excessively large, black tone becomes significant throughout the cathode side. In particular, when the Ca film has a thickness of approximately 80 angstroms, it is believed that a continuous film is formed having a certain level of thickness such that electrical conductance can be achieved. From this point of view, it is also preferable that the thickness of the first cathode 5 be 80 angstroms or less. In addition, as the cathode, Au may also be used.

The first cathode 5 described above can be formed by vacuum deposition at a degree of vacuum of, for example, $1 \times 10^{-6}$ torr or more.

In addition, for the second cathode 6, a material having a work function higher than that of the first cathode 5 is used. As a material therefor, a material, which has a work function not significantly higher than that of a material for the first cathode 5, has a certain level of stability to oxygen, and can easily form a continuous film, is preferably used. In particular, Al and Ag may be used.

In particular, when Ca is used for the first cathode 5, it is preferable that Al or the like be used as a material for the second cathode 6. The thickness of the second cathode 6 described above is preferably set to be 10 to 20 angstroms, and more preferably, is set to be 10 angstroms. When it is less than 10 angstroms, electrical conductance cannot be obtained, and in addition, when it is more than 20 angstroms, there may be a risk in that the transmittance is significantly decreased by metal reflection of the material (particularly, a metal material) itself for the second cathode 6.

In the present invention, as described above, by forming a layer formed of a material having a low work function (3.0 eV or less) as the first cathode 5 and by forming a layer, which is a continuous layer and has a work function higher than that described above, on the first cathode 5 as the second cathode 6, the degradation of the first cathode 5 is prevented. In addition, since the total thickness of the first cathode 5 and the second cathode 6, which form the stacked structure, is formed so as to be 100 angstroms or less, the light transmission characteristics at the cathode side is ensured.

As a method for forming the stacked structure of the cathodes described above, it is preferable that after the first cathode 5 is formed by deposition, it be confirmed that the degree of vacuum reaches a level approximately equivalent to that at which the first cathode 5 is deposited, and the second cathode 6 be then formed under conditions similar to those for the first cathode 5.

As the first sealing layer 7, for example, LiF, SiO, or $SiO_2$ is used. In particular, since a film of LiF can be easily formed by a vacuum deposition method, the device can be formed without being exposed in the air from the film formation of the cathode to a subsequent series of operations in an inert atmosphere, and in addition, since the material itself contains no oxygen atom, conditions containing oxygen at a nearly zero concentration thereof can be maintained. Furthermore, the transmittance in the visible light region is also high, and the transmission characteristics are not degraded. The thickness and the deposition rate are set to be 300 to 500 angstroms and 8 angstroms/sec or more, respectively. When the thickness is less than 300 angstroms, it is difficult to protect the cathode, which is a lower layer, against water and oxygen from the outside air and the infiltration of water and air from the second sealing layer 8, which is an upper layer, by sealing. In addition, when the thickness of the film is more than 500 angstroms, the device (in many cases, light-emitting layer) is damaged by heat radiation during deposition, and hence, there may be a risk in that the intrinsic EL light-emitting characteristics are damaged. Furthermore, when the deposition rate is 8 angstroms/sec, since the deposition time is long, device degradation also occurs by heat radiation as is the case described above. As a result, the deposition rate is also limited, and hence, it is required to have 8 angstroms/sec or more.

As the second sealing layer 8, for example, a transparent heat curable epoxy resin or a photocurable epoxy resin is used. In particular, a heat curable epoxy resin is preferable, and more particularly, coating thereof is performed by dipping, a glass substrate, which is the sealing substrate 9, is placed thereon, and curing is then performed in an inert atmosphere, thereby forming the sealing layer. As the epoxy resin, a moisture-proof resin, such as DPpure60 (manufactured by 3M), or STYCAST1269A (Emeron), may be used.

Hereinafter, the present invention will be described in detail with reference to examples.

Example 1

An organic EL device having a structure shown in FIG. 1 was formed.

Operations described below were all performed in a clean room.

On a washed glass substrate 1 of 150 mm square, an (transparent) electrode (anode) 2 (IDLXO) having 1,000 angstroms thick was formed by sputtering. The conditions therefor were: a degree of vacuum of $1 \times 10^{-4}$ Pa or less, an Ar to $O_2$ flow ratio of 10:1, 320 V, 0.15 mA, and 14 minutes. Next, an oxygen plasma treatment was performed on the anode film formed on the glass substrate at a current of 10 mA for 5 minutes. In particular, VPS020 manufactured by Sanyu Electron Co., Ltd. was used, and the treatment was performed after purging were performed 2 to 3 times using oxygen.

Subsequent operations described below were performed in a closed container. The conditions in the closed container were such that the oxygen concentration was 0.01 ppm or less, and a dew point of water was −70° C. or less.

First, a mixture of PEDOT (polyethylenedioxythiophene) and PSS (polystyrene sulfonate) was applied as a hole injection/transport material on the electrode 2 processed by the plasma treatment described above. The mixture described above could be obtained from Bayer A. G. as Baytron P. In this example, a solution was formed by mixing Baytron P with PSS in a ratio of 5:1 and by diluting the mixture with water to 1.5 times, and by using the solution thus obtained, a film was formed by spin coating. Under conditions, such as a slope of 1 second, 3,000 revolutions, and 45 seconds, a film 600 angstroms thick was formed. By firing the film at 200° C. for 10 minutes, film formation was performed, thereby yielding a hole injection/transport layer 3.

Next, on the hole injection/transport layer 3, a solution of a fluorene-based polymer having a structure shown below dissolved in a xylene solvent was applied by spin coating so as to have a film thickness of 800 angstroms, thereby forming a light-emitting layer 4.

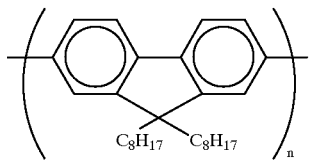

Subsequently, on the light-emitting layer 4, first, a film formation (deposition) of Ca was performed in a vacuum deposition apparatus so as to form a first cathode 5. The vacuum deposition apparatus disposed in the closed container was used. The degree of vacuum at the beginning was approximately $1\times10^{-6}$ torr. The deposition rate was set to be 3 angstroms/sec, and the film thickness was set to be 70 angstroms. Next, after the degree of vacuum again reaches $1\times10^{-6}$ torr, a film 10 having angstroms thick was formed as the second cathode 6 by depositing Al at a deposition rate of 3 angstroms/sec.

Next, on the second cathode 6, as a first sealing layer 7, a film having 500 angstroms thick was formed by depositing LiF at a deposition rate of 8 angstroms/sec.

After cooling, on the first sealing layer 7, DPpure60 (manufactured by 3M) was applied (film thickness, 200 μm) which was a moisture-proof epoxy resin, thereby forming a second sealing layer 8. A sealing glass (thickness, 0.3 mm) was then adhered thereto as a sealing substrate 9, and compressing was performed by a hot plate under conditions, at 50° C. for 12 hours, whereby curing was performed. In this step, in order to remove air bubbles in the epoxy resin, heating was performed at a degree of vacuum of approximately 0.1 torr. As a result, an organic EL device was obtained.

For the organic EL device thus obtained, the transmittance and the threshold voltage were measured. The measurement of the transmittance was performed by using a spectroscope (manufactured by Hitachi, Ltd.), in which air was used as the base line, and a pinhole of 3 mm in diameter was provided at a condenser portion. The measurement of the threshold voltage was performed using BM-7 (manufactured by Kabushiki Kaisha Topcon), and the threshold voltage was defined by a voltage at which a luminance of 5 $Cd/m^2$ is output.

Figure 2:
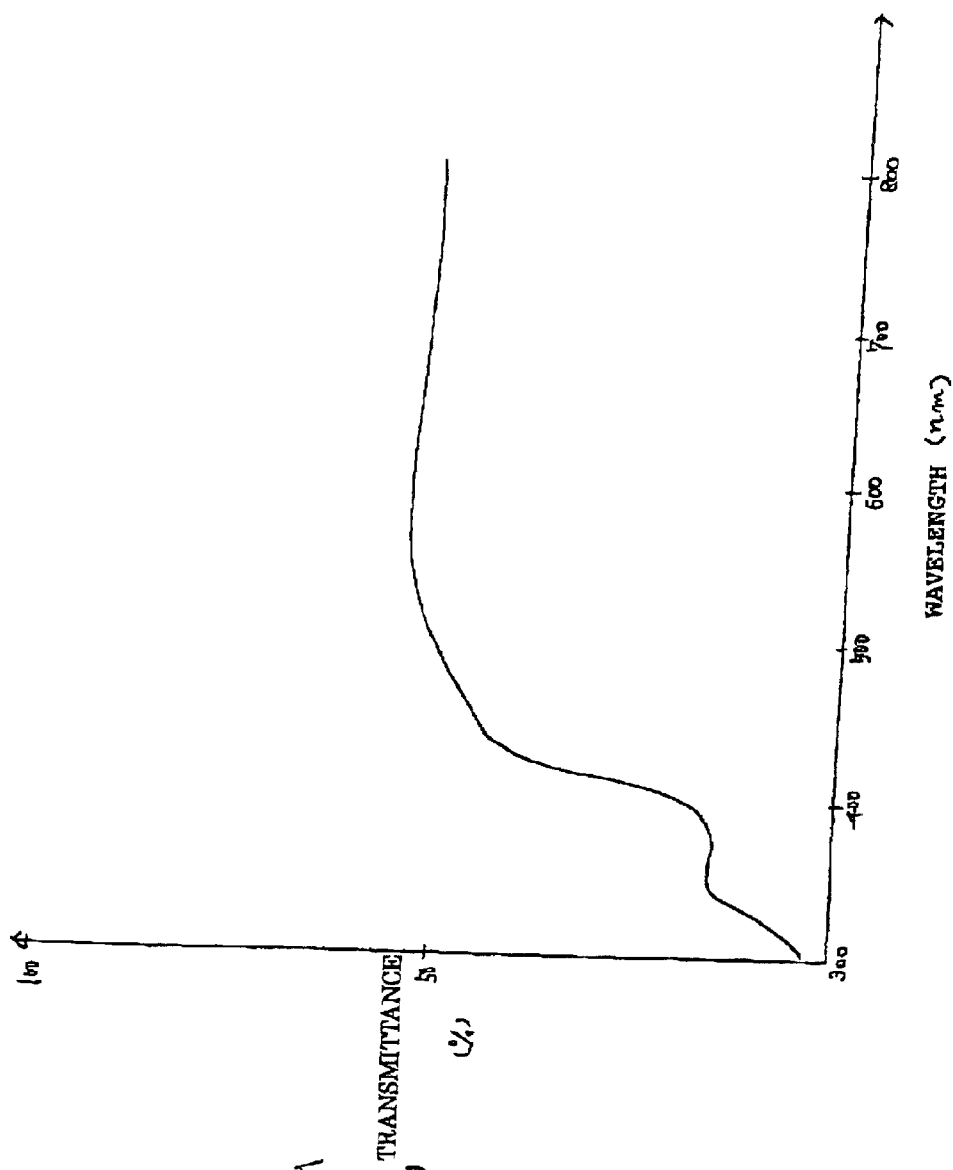
FIG. 2 is a graph showing a transmission spectrum in the visible light region of an organic EL device formed in Example 1 of the present invention.

The results are shown in FIG. 2.

According to the results shown in FIG. 2, it was understood that the transmittance was 50% or more over almost the entire visible light region. In consideration of the glass substrate 1 having a thickness of 1.1 mm, and the transmittance thereof being approximately 75%, it was believed that a transmittance of 70% or more was achieved. In the case described above, the threshold voltage was 3 V.

Example 2

Figure 3:
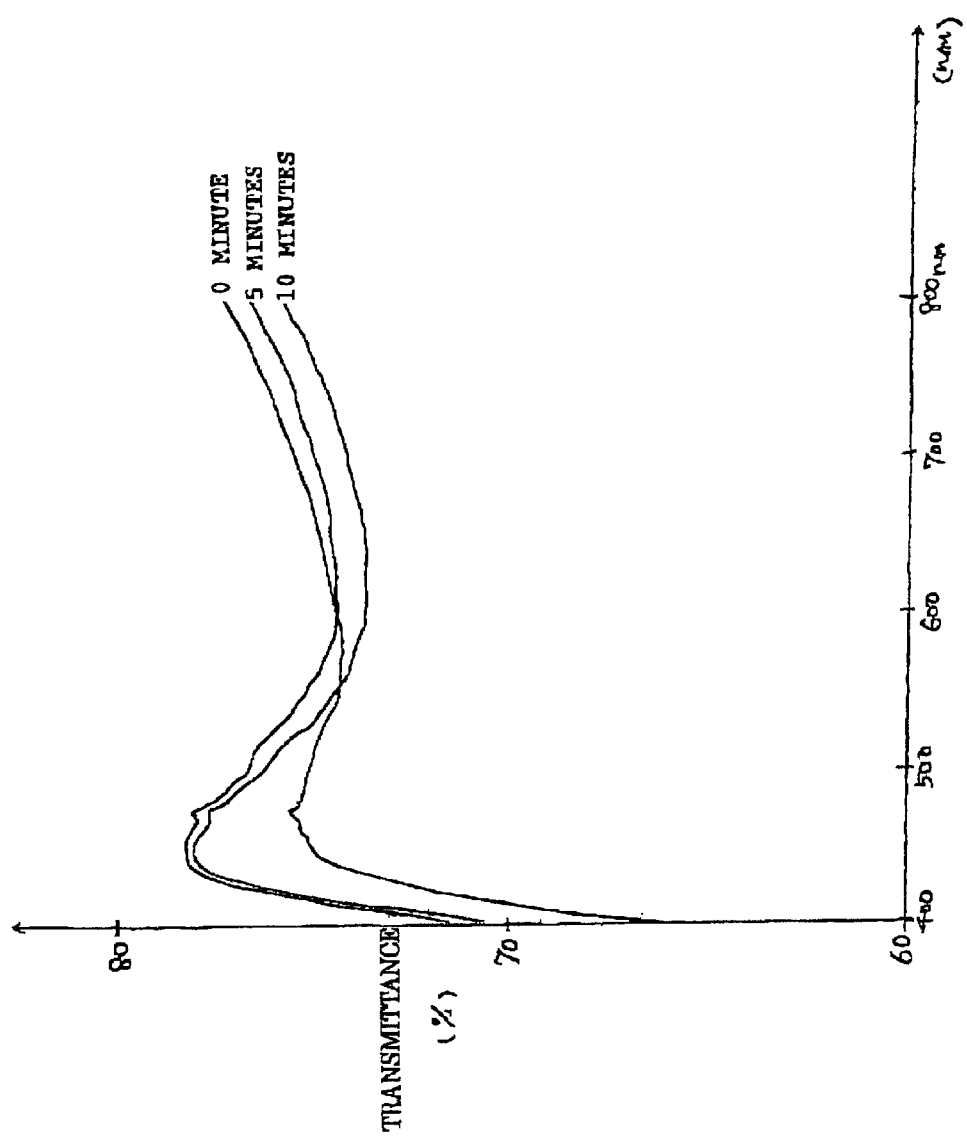
FIG. 3 is a graph of the transmission spectrum showing time dependence of a change in transmittance of a device processed by an oxygen plasma treatment in an example of the present invention.

In accordance with the method described in Example 1, glass substrates, each having an anode stacked thereon, were obtained, wherein the anodes formed of transparent electrodes were processed by an oxygen plasma treatment for from 0 to 10 minutes at one-minute intervals. For glass substrates having anodes thereon, which were processed for 0, 5 (Example), and 10 minutes, transmission spectrums (transmittance at each wavelength) were measured. The results are shown in FIG. 3. In addition, for the glass substrates having anodes thereon, which were processed for from 0 to 10 minutes at one-minute intervals, transmittances at 450 nm, 550 nm, and 700 nm were measured. The results are shown in Table 1.

TABLE 1

| | Time for an Oxygen Plasma Treatment 0 (min) | 1 (min) | 2 (min) | 3 (min) | 4 (min) | 5 (min) | 6 (min) | 7 (min) | 8 (min) | 9 (min) | 10 (min) |
|---|---|---|---|---|---|---|---|---|---|---|---|
| Transmittance (%; at 450 nm) | 75.2 | 75.8 | 76.3 | 77 | 77.5 | 78.2 | 78.3 | 78.2 | 78.1 | 78.2 | 78.1 |
| Transmittance (%; at 550 nm) | 74.6 | 74.7 | 74.9 | 75 | 75.2 | 75.2 | 75.3 | 75 | 74.8 | 74.5 | 74.3 |

TABLE 1-continued

|  | Time for an Oxygen Plasma Treatment 0 (min) | 1 (min) | 2 (min) | 3 (min) | 4 (min) | 5 (min) | 6 (min) | 7 (min) | 8 (min) | 9 (min) | 10 (min) |
|---|---|---|---|---|---|---|---|---|---|---|---|
| Transmittance (%; at 700 nm) | 75.8 | 75.7 | 75.5 | 75.5 | 75.3 | 75.2 | 75 | 74.9 | 74.6 | 74.4 | 74.3 |

In the blue region (450 nm), an increase in transmittance was observed until 5 minutes elapse from the start of the treatment. In the green region (550 nm), even though a significant change was not observed, the transmittance exhibited the maximum value approximately 5 minutes after the start of the treatment. In the red region (700 nm), as the treatment time elapsed, the transmittance was decreased even though this decrease was not significant. It is believed that the phenomenon described above occurred by a change of the band structure, since the material was partly changed due to the oxidation of the surface thereof by the treatment. Accordingly, it was considered that a treatment time of approximately 5 minutes was an optimum condition.

Example 3

Organic EL devices were formed in a manner similar to that in Example 1, except that the first cathodes were formed so as to have thicknesses of 40, 50, 60, 80, 90, and 100 angstroms. The threshold voltages and the transmittances at a wavelength of 550 nm were measured for the individual organic EL devices. In Table 2, the results of the threshold voltages and the transmittances (a wavelength region of 550 nun) are shown together with the results of Example 1 (the first cathode having a film thickness of 70 angstroms).

TABLE 2

|  | Film Thickness of First Cathode 40 (Å) | 50 (Å) | 60 (Å) | 70 (Å) | 80 (Å) | 90 (Å) | 100 (Å) |
|---|---|---|---|---|---|---|---|
| Threshold voltage (V) | 5 | 3.5 | 3.5 | 3 | 2.9 | 2.9 | 2.9 |
| Transmittance (%, at 550 nm) | 61 | 59 | 56 | 54 | 50 | 45 | 38 |

Concerning the threshold voltage, it was asymptomatically stabilized at a film thickness of the first cathode of approximately 70 angstroms. An increase in threshold voltage was observed when the film thickness was not more than 70 angstroms. It is believed that the phenomenon described above occurred by an increase in resistance caused by the influence of the work function of the second cathode, or by the insufficient film thickness of the second cathode.

The transmittance was decreased with the change in film thickness of the first cathode, the acceptable level was up to approximately 90 angstroms (a total thickness of the first and the second cathodes of 100 angstroms), and at a level of the thickness of the first cathode higher than that mentioned above (a level higher than that of a total thickness of the first and the second cathodes of 100 angstroms), the transmittance was excessively decreased. According to the results described above, it was believed that a film thickness of approximately 70 angstroms of the first cathode was an optimum value.

Example 4

Organic EL devices were formed in a manner similar to that in Example 1, except that the second cathodes were formed so as to have thicknesses of 5, 15, 20, 25, and 40 angstroms. The threshold voltages and the transmittances at a wavelength of 550 nm were measured for the individual organic EL devices. In Table 3, the results of the threshold voltages and the transmittances are shown together with the results of Example 1 (the second cathode having a film thickness of 10 angstroms).

TABLE 3

|  | Film Thickness of Second Cathode 5 (Å) | 10 (Å) | 15 (Å) | 20 (Å) | 25 (Å) | 40 (Å) |
|---|---|---|---|---|---|---|
| Threshold voltage (V) | No Light Emission | 3 | 3.1 | 3 | 3 | 3 |
| Transmittance (%, at 550 nm) | 57 | 54 | 49 | 43 | 32 | 20 |

Concerning the threshold voltage, when the thickness thereof was 10 angstroms or more, the change could not be observed. When the thickness was 10 angstroms or less, it is believed that light emission was not performed since conductance could not be obtained. Since a constant value was obtained, it was believed that there was no influence of the work function of the second cathode. A decrease in transmittance was significant compared to the case in which Ca was used. It is believed that the phenomenon was caused by Al, which had high conductivity and high reflectance.

As has been thus described in detail, according to the present invention, the transmittance in the visible region is enhanced, sealing defects are reduced, and the influence of oxygen, water, and the like in the outside air can be minimized as much as possible. In addition, as a transmissive type organic EL device, a device can be realized which has a long life, is driven at a low voltage, and has a high transmittance in the visible light region.

What is claimed is:

1. An organic electroluminescent device, comprising:
   a substrate;
   an anode;
   a light-emitting layer formed of an organic material; and
   a cathode including a first cathode formed of a material having a work function of 3.0 eV or less and a second cathode formed of a material having a work function higher than the work function of the first cathode, the first and second cathodes being sequentially stacked in this order from the side of the light-emitting layer, a total thickness of the first and the second cathodes being 100 angstroms or less, and light being emitted to an exterior of the device via at least the cathode, the thickness y (angstrom) of the first cathode being such that $55 \leq y \leq 65$, the thickness z (angstrom) of the second cathode being such that $10 \leq z \leq 20$.

2. The organic electroluminescent device according to claim 1, the device at the cathode being sealed by a sealing layer formed of a light transmissive material.

3. The organic electroluminescent device according to claim 1, the first cathode including Ca.

4. The organic electroluminescent device according to claim 1, the second cathode including Al.

5. The organic electroluminescent device according to claim 1, the organic material forming the light-emitting layer being a polymeric material.

6. The organic electroluminescent device according to claim 1, the first cathode including Au.

7. The organic electroluminescent device according to claim 2, the sealing layer including Au.

8. The organic electroluminescent device according to claim 2, a thickness of the sealing layer including LiF being more than 300 angstrom and less than 500 angstrom.

* * * * *